Figure 1A:
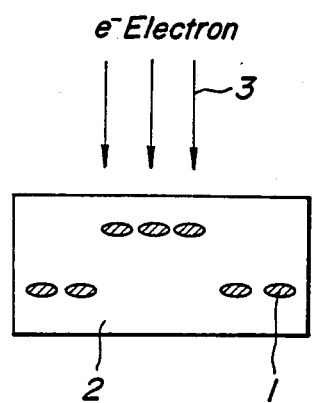

United States Patent [19]

Mori et al.

[11] Patent Number: 4,670,291
[45] Date of Patent: Jun. 2, 1987

[54] METHOD OF CONTROLLING SUPERSATURATED INJECTION AND CONCENTRATION OF EXOTIC ATOMS INTO DEEP PORTIONS OF A SOLID WITH A HIGH ENERGY ELECTRON BEAM

[75] Inventors: Hirotaro Mori, Suita; Hiroshi Fujita, Ibaraki, both of Japan

[73] Assignee: Osaka University, Suita, Japan

[21] Appl. No.: 776,150

[22] Filed: Sep. 13, 1985

[30] Foreign Application Priority Data

Oct. 5, 1984 [JP] Japan .................................. 59-208304

[51] Int. Cl.$^4$ .............................................. B05D 3/06
[52] U.S. Cl. .................................. 427/35; 250/492.3
[58] Field of Search ....................... 427/35; 250/492.3

[56] References Cited

U.S. PATENT DOCUMENTS

| | | | |
|---|---|---|---|
| 2,911,533 | 11/1959 | Damask | 250/492.3 |
| 4,486,247 | 12/1984 | Ecer et al. | 427/38 |
| 4,532,149 | 7/1985 | McHargue | 427/38 |

*Primary Examiner*—John H. Newsome
*Attorney, Agent, or Firm*—Spencer & Frank

[57] ABSTRACT

A method of controlling supersaturated injection of exotic atoms comprises previously preparing a parent material buried by exotic phases consisting Ge or Si, irradiating the parent material with the electron beams, and forming supersaturated injection regions of the exotic atoms to control the concentration profile of the exotic atoms. The method can control the distribution of concentration of exotic atoms by irradiating with electron beams of high energy.

9 Claims, 3 Drawing Figures

METHOD OF CONTROLLING SUPERSATURATED INJECTION AND CONCENTRATION OF EXOTIC ATOMS INTO DEEP PORTIONS OF A SOLID WITH A HIGH ENERGY ELECTRON BEAM

BACKGROUND OF THE INVENTION

1. Field of the Invention

This invention relates to a method of controlling supersaturated injection and concentration of exotic atoms into deep portions of a solid with high energy electron beams in material engineering.

2. Related Art Statement

Hitherto, the supersaturated injection of exotic atoms by which prescribed exotic atoms are forcibly introduced into given places in a solid metal has been mainly conducted by an ion implantation method.

However, in this ion implantation method, the introduction of exotic atoms is limited to the regions just below the surface of a sample. Further, severe irradiation damage is inevitable in the implantation regions. Therefore, the utilization of this method is limited.

SUMMARY OF THE INVENTION

It is an object of this invention to provide a method for controlling artificially the distribution of concentration of exotic atoms which were previously introduced into a solid metal, by a new method using irradiation by electron beams of high energy. According to this method, while the damage by irradiation is made negligible under controlled conditions, prescribed exotic atoms can be injected into given places of deep parts of a solid under a supersaturated condition.

This invention is a method comprising preparing previously a parent material where exotic phases consisting of exotic atoms of the object are buried into fixed places of parent phases, irradiating the parent material by electron beams having sufficient energy to displace the atoms which constitute the both phases, whereby injection regions of supersaturation of the exotic atoms are formed at the given places in the parent phases, and the concentration profile of the exotic atoms in regions from the exotic phases to the parent phases is optionally controlled.

In this invention, the parent material which contains the exotic phase regions consisting of the prescribed exotic atoms is made by methods of vapor deposition, sintering, clad rolling etc. It is preferable to use metals having a face-centered cubic lattice such as aluminium, gold etc. as the parent phases. It is preferable to use germanium or silicon as the exotic atoms forming exotic phase regions in the parent phases of aluminium or gold.

Figure 1B:
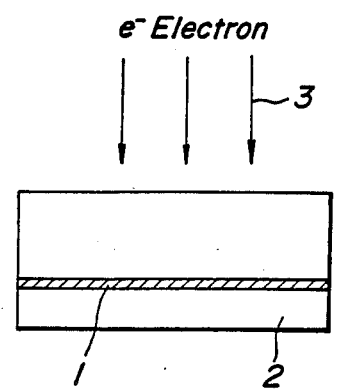
Figure 2:
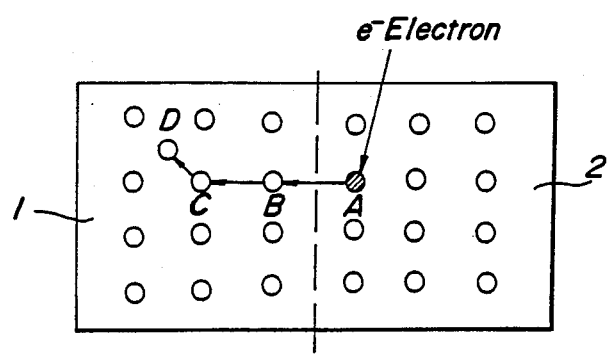

FIGS. 1(a) and 1(b) are schematic cross-sectional views of examples of method of this invention; and FIG. 2 is a schematic view showing a movement of atoms by the electron beam irradiation.

In FIGS. 1(a) and 1(b), parent materials containing regions of exotic phases 1 of an island form and a layer form, respectively, are illustrated. These materials are irradiated with electron beams 3 which have sufficient energy to make displacement of atoms which constitute the exotic phases 1 and parent phases 2. The irradiation is conducted at sufficiently low temperatures to restrain to control the thermal diffusion of the exotic atoms. By such irradiation, each exotic atom collides against electrons e to jump randomly P times per second (regarding the electron energy as 2 MeV and the electron beam strength as $10^{24}$ e/m².s, P is about $10^{-2}$–$10^{-3}$/s). As a result, the exotic atoms which are previously introduced are mutually diffused with the parent phase atoms, and each exotic phase region connects with the parent phase so as to have a sloping concentration profile of the exotic atoms. Namely, the supersaturated injection of the exotic atoms into the parent phases is accomplished.

The distribution of concentration of the exotic atoms is controlled by (i) the initial forms of the exotic phase ranges, and (ii) the parameters of exposures, temperatures etc.

Showing the conditions of the electron irradiation that use aluminium as the parent phases and silicon as the exotic phases, the irradiation limits of the electron energy are 1-10 MeV, preferably 2-5 MeV. The number P of collisions between electrons and atoms irradiated by the electron beams increase with the increase of the electron energy. When the electron energy is more than 10 MeV, it may be activated by the nuclear transmutation of substance. When the electron energy is less than 1 MeV, as the number P of collisions becomes too few, and as it takes a long time to induce necessary change of concentration (or diffusion length), such a low electron energy is not preferable. The limits of electron intensity are $10^{23}$–$10^{25}$ e/m².s, preferably about $10^{24}$ e/m².s. When the electron intensity is more than $10^{25}$ e/m².s, it is difficult to make an electron gun. When the electron intensity is less than $10^{23}$ e/m².s, as its irradiation time increases, it is not useful. When the electron intensity is high, the irradiation time of the electron beams may be short. When the electron intensity is low and hence, long irradiation times are required, the limits of the times are about $10^3$–$10^5$. The irradiation temperatures are less than 173° K. When the irradiation temperatures are too high, the thermal diffusion of atoms is induced to deposit the exotic atoms only. As these atoms do not show a solid solution condition but show a segregation or deposit condition, such high temperatures are not preferable.

In order to more fully describe the present invention, the following example is given. This example shows the irradiating conditions which are necessary to conduct the supersaturated injection of this invention.

(EXAMPLE)

Aluminium plates having thickness of 3 μm were used as the parent phases, and minute germanium plates having a thickness of 100A and a diameter of about 1 μm were used as the exotic phases. The germanium plates were heat treated to bury them in the aluminium plates. The obtained samples were irradiated with the electron beams having electron energy of 2 MeV and electron intensity of $10^{24}$ e/m².s at an irradiation temperature of 93° K. for $10^4$ seconds.

When the target metal crystals were irradiated by the electron beam which was accelerated over its threshold voltage (The value thereof is determined by the kinds of materials, for example, the value for aluminium is about 160 kV), some atoms which constituted the crystals were sprung out from their lattice points, and then these atoms were moved to adjacent lattice points. This condition is illustrated by the FIG. 2. It is assumed that the region of the exotic phase 1 is made from germanium atoms only, and the region of the parent phase 2 is made from aluminium atoms only. "A" sprung out by the electron $e^-$ moves to the position of "B," "B" moves to the position of "C" and "C" moves to the position of "D". As a result, an aluminium atom comes to enter into the germanium region. Of course, there are atoms which move from the exotic phase 1 to the parent phase 2 in the other places. Therefore, by the repetition of such a movement, the interface of the exotic phase 1 and the parent phase 2 becomes gradually indistinct.

When this state is directly observed by an electron microscope while the crystals are irradiated with the electron beams, the minute germanium plates become gradually smaller and then some of them disappear fully. Finally, the deposit reproduces a solid solution in the aluminium phase. On the way to this final state, the germanium plates become amorphous. It is found that the germanium plates melt successively into crystal deposits→amorphous deposits→reproduced of solid solutions.

When silicon plates are used instead of the germanium plates, the same results are obtained.

The effect of this invention is as follows.

(A) In the conventional ion implantation method, the introduction of the exotic atoms was limited to the regions of several hundreds of angstrom deep at most below the surface. As this invention uses electron beams having a particularly great transmissivity as its irradiation source, it is possible to conduct the supersaturated injection of the exotic atoms into optional places of the parent material having a thickness of several tens of microns.

(B) Furthermore, if the shape and the distribution of the introduced regions of the exotic phases are previously controlled, it is possible to form various shapes of supersaturated injection regions in the parent phases, which shapes are difficult to form by the ion implantation method. For example, when the exotic phase regions having thin platelike shape in one phase or multiple phases are introduced into parent phases, and when parent materials in which exotic regions of stick form are introduced in a state of a draining board into parent phases are prepared, materials having supersaturated injection regions of exotic atoms which have two-dimensional and one-dimensional characteristics respectively can be obtained.

(C) Further, in the method of this invention, since electron beams are used as irradiating sources, the shape and the size of exotic phases can be controlled by the electromagnetic field with greater precision than that in the ion implantation method. Thus, local supersaturated injection regions having the diameter of several tens of angstroms can be precisely formed at the required places in the parent phases.

(D) In the conventional ion implantation method, the kinds of exotic atoms which are injected under the supersaturated condition is usually limited to one kind. However, in this invention, the chemical components of the exotic phases which are previously introduced can be freely chosen. Accordingly, plural kinds of atoms can be injected into the same parent phase under the supersaturated condition at the same time as occasion demands at the required rate. This is one of the special features of this invention.

This invention is useful in the production of (1) electronic materials, amorphous materials and various composite materials, in which exotic atoms of any amount are injected into any three-dimentional places, (2) new materials containing more than two kinds of exotic atoms which are unexpected from the phase diagrams, under the supersaturated condition at a three-dimentional state, (3) electronic materials and various composite materials which have sloping concentration profiles between the exotic phases and the parent phases, etc.

What is claimed is:

1. A method of controlling injection and concentration of exotic atoms into deep portions of a solid with an electron beam having high energy enough to cause supersaturation, comprising
    previously preparing a parent material having a face-centered cubic lattice by a fabricating method selected from among vapor depositing, sintering and clad rolling whereby exotic phases composed of exotic atoms are buried into predetermined places of parent phases composed of the parent material,
    irradiating the parent material with the electron beam having high energy enough to displace the atoms which compose the exotic phases and the parent phases at a temperature which is low enough to restrain thermal diffusion of the exotic atoms,
    whereby supersaturated injection regions of the exotic atoms are formed at the predetermined places in the parent phases.

2. The method according to claim 1, wherein the irradiating step is conducted at an electron beam energy and for a time sufficient to provide a predetermined concentration profile of the exotic atoms in regions extending from the exotic phases to the parent phases.

3. A method of injecting exotic atoms into deep parts of a solid with electron beams of high energy to produce regions supersaturated with exotic atoms, the method comprising:
    preparing a parent material having exotic phases consisting of exotic atoms of germanium or silicon in parent phases consisting of atoms of a metal having a face-centered cubic lattice by burying the exotic phases at predetermined places in the parent phases by a method selected from among vapor deposition, sintering, and clad rolling;
    irradiating the parent material with an electron beam and at a temperature which substantially restrains thermal diffusion, the electron beam having sufficient energy to displace both the atoms which constitute the exotic phases and the atoms which constitute the parent phases by collisions which propagate at a jump rate P.

4. The method according to claim 3, wherein the irradiating step is conducted at an electron beam energy and for a time sufficient to provide a predetermined concentration profile of the exotic atoms in regions extending from the exotic phases to the parent phases.

5. The method according to claim 3, wherein the electron beam has an electron energy ranging from 1 to 10 MeV.

6. The method according to claim 5, wherein the electron beam has an electron intensity ranging from $10^{23}$ to $10^{25}$ e/m$^2$.s.

7. The method according to claim 3, wherein the irradiation temperature is less that 173° K.

8. The method according to claim 3, wherein irradiation takes place over a time which does not exceed $10^5$.s.

9. The method according to claim 3, wherein the metal of the parent phases is selected from the group consisting of aluminum and gold.

* * * * *